United States Patent
Moghe

(10) Patent No.: US 9,530,765 B1
(45) Date of Patent: Dec. 27, 2016

(54) DISTRIBUTING CAPACITANCE WITH GATE DRIVER FOR POWER SWITCH

(71) Applicant: Silanna Asia Pte Ltd., Singapore (SG)

(72) Inventor: Yashodhan Vijay Moghe, Marsfield (AU)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/135,297

(22) Filed: Apr. 21, 2016

Related U.S. Application Data

(60) Provisional application No. 62/154,900, filed on Apr. 30, 2015.

(51) Int. Cl.
   *H01L 27/02* (2006.01)
   *H03K 17/687* (2006.01)

(52) U.S. Cl.
   CPC ....... *H01L 27/0207* (2013.01); *H03K 17/6871* (2013.01)

(58) Field of Classification Search
   CPC ............. H01L 27/0203; H01L 27/0207; H01L 27/0629; H03K 17/6871
   USPC ..... 326/82, 83; 327/108, 109, 564, 565, 566
   See application file for complete search history.

(56) References Cited

U.S. PATENT DOCUMENTS

| | | |
|---|---|---|
| 6,680,646 B2 | 1/2004 | Disney |
| 7,042,026 B2 | 5/2006 | Kameda |
| 8,400,778 B2 | 3/2013 | Hsing et al. |
| 2008/0283965 A1* | 11/2008 | Nakamura ........ H01L 21/82387 257/532 |
| 2014/0151795 A1 | 6/2014 | Lotfi et al. |
| 2014/0300413 A1* | 10/2014 | Hoyerby ................. H02M 1/08 330/251 |
| 2014/0313789 A1 | 10/2014 | Dujic et al. |
| 2016/0165715 A1* | 6/2016 | Kahrimanovic ..... H05K 1/0203 361/709 |

FOREIGN PATENT DOCUMENTS

JP    3696211 B2    9/2005

OTHER PUBLICATIONS

Nakamura et al., 10A 12V 1 chip DC/DC converter IC using bump technology, IEEE Bipolar/BiCMOS Circuits and Technology Meeting, Oct. 2006, pp. 1-4.

* cited by examiner

*Primary Examiner* — William Hernandez
(74) *Attorney, Agent, or Firm* — The Mueller Law Office, P.C.

(57) ABSTRACT

A semiconductor device includes a semiconductor die, a power switch, a gate driver, and decoupling capacitor. The power switch includes a power FET having a plurality of power FET segments formed in the semiconductor die. The gate driver has a plurality of gate driver segments formed in the semiconductor die, at least a portion of the gate driver segments being distributed among the power FET segments. The decoupling capacitor has a plurality of decoupling capacitor segments formed in the semiconductor die, the decoupling capacitor segments being distributed among the gate driver segments.

9 Claims, 6 Drawing Sheets

FIG. 3

| Power FET | Power FET | Power FET | Power FET |
| Gate Driver | Gate Driver | Gate Driver | Gate Driver |
| Power FET | Power FET | Power FET | Power FET |
| Gate Driver | Gate Driver | Gate Driver | Gate Driver |
| Power FET | Power FET | Power FET | Power FET |
| Gate Driver | Gate Driver | Gate Driver | Gate Driver |
| Power FET | Power FET | Power FET | Power FET |
| Gate Driver | Gate Driver | Gate Driver | Gate Driver |

FIG. 4

| Power FET | Power FET | Power FET | Power FET |
| Cap | Cap | Cap | Cap |
| Gate Driver | Gate Driver | Gate Driver | Gate Driver |
| Power FET | Power FET | Power FET | Power FET |
| Cap | Cap | Cap | Cap |
| Gate Driver | Gate Driver | Gate Driver | Gate Driver |
| Power FET | Power FET | Power FET | Power FET |
| Cap | Cap | Cap | Cap |
| Gate Driver | Gate Driver | Gate Driver | Gate Driver |
| Power FET | Power FET | Power FET | Power FET |
| Cap | Cap | Cap | Cap |
| Gate Driver | Gate Driver | Gate Driver | Gate Driver |

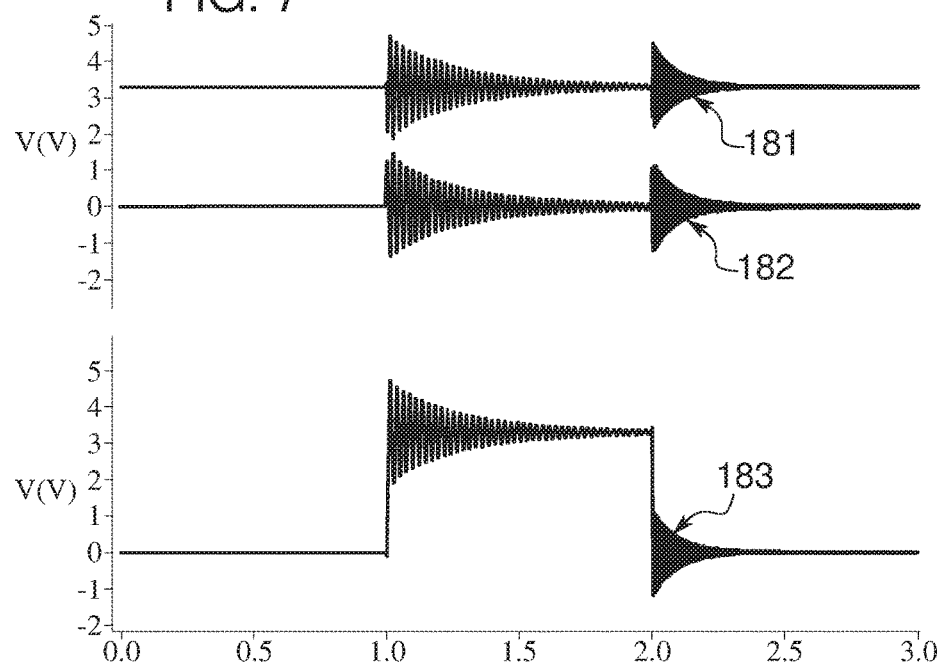
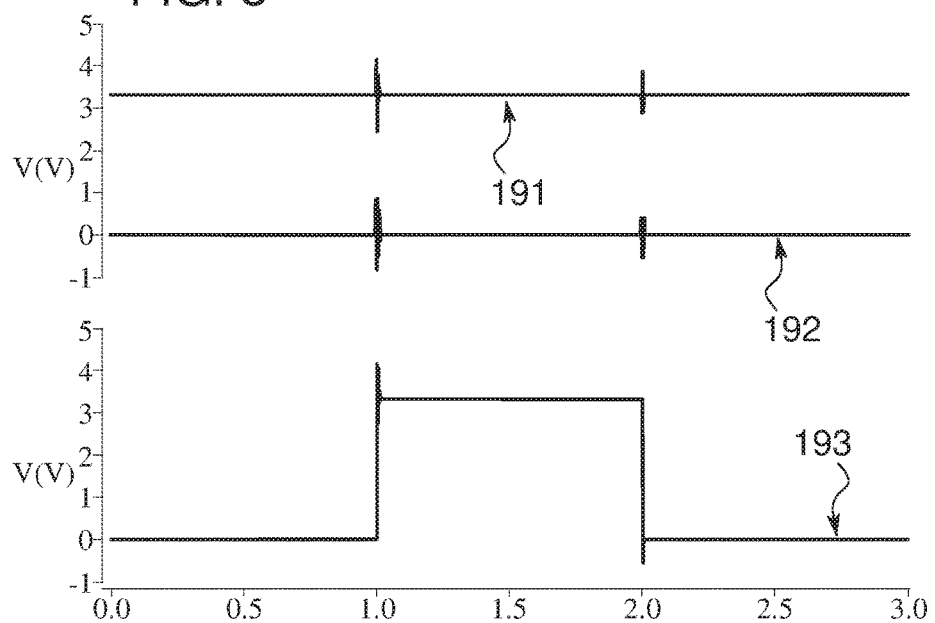

FIG. 9

| Power FET | Power FET | Power FET | Power FET |
|---|---|---|---|
| Part of Gate Drv | Part of Gate Drv | Part of Gate Drv | Part of Gate Drv |
| Power FET | Power FET | Power FET | Power FET |
| Part of Gate Drv | Part of Gate Drv | Part of Gate Drv | Part of Gate Drv |
| Power FET | Power FET | Power FET | Power FET |
| Part of Gate Drv | Part of Gate Drv | Part of Gate Drv | Part of Gate Drv |
| Power FET | Power FET | Power FET | Power FET |
| Part of Gate Drv | Part of Gate Drv | Part of Gate Drv | Part of Gate Drv |
| Bulk of Gate Driver ||||

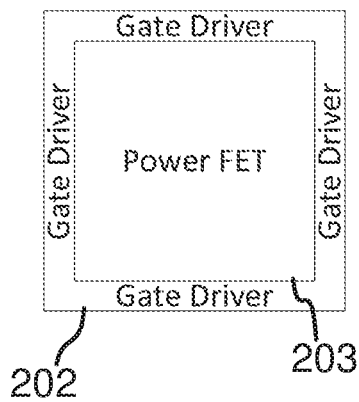

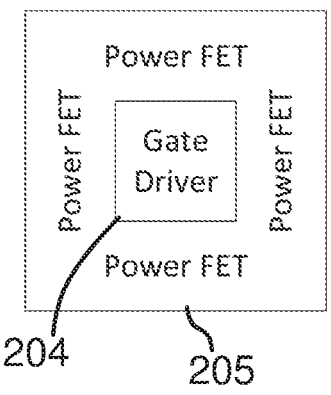

204   205

DISTRIBUTING CAPACITANCE WITH GATE DRIVER FOR POWER SWITCH

RELATED APPLICATIONS

This application claims the benefit of U.S. Provisional Patent Application No. 62/154,900 filed on Apr. 30, 2015 and entitled "Distributing Capacitance with Gate Driver for Power Switch"; which is hereby incorporated by reference for all purposes.

BACKGROUND OF THE INVENTION

Traditional DC/DC power converters, or switches, use multiple discrete power field effect transistors (FETs) and gate drivers. This layout has limitations in how quickly the power FET can be switched on and off, due to inherent inductances and capacitances in the circuit. Errors can also result in the power FET turning on when it should remain off, which can further reduce the power conversion efficiency. In other known designs, the gate driver and power FET are located on the same die to reduce the inductance. However, a significant series inductance still remains, which affects performance of the converter.

SUMMARY

A semiconductor device includes a semiconductor die, a power switch, a gate driver, and decoupling capacitor. The power switch includes a power FET having a plurality of power FET segments formed in the semiconductor die. The gate driver has a plurality of gate driver segments formed in the semiconductor die, at least a portion of the gate driver segments being distributed among the power FET segments. The decoupling capacitor has a plurality of decoupling capacitor segments formed in the semiconductor die, the decoupling capacitor segments being distributed among the gate driver segments.

BRIEF DESCRIPTION OF DRAWINGS

FIG. 3 shows a simplified layout diagram of a power switch in accordance with some embodiments.

FIG. 4 shows a simplified layout diagram of an alternative power switch in accordance with some embodiments.

FIG. 7 shows an example transient response graph of a prior art power FET.

FIG. 8 shows an example transient response graph of a power FET in accordance with some embodiments.

FIG. 9 shows a simplified layout diagram of another alternative power switch in accordance with some embodiments.

FIG. 10 shows a simplified layout diagram of another alternative power switch in accordance with some embodiments.

FIG. 11 shows a simplified layout diagram of another alternative power switch in accordance with some embodiments.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
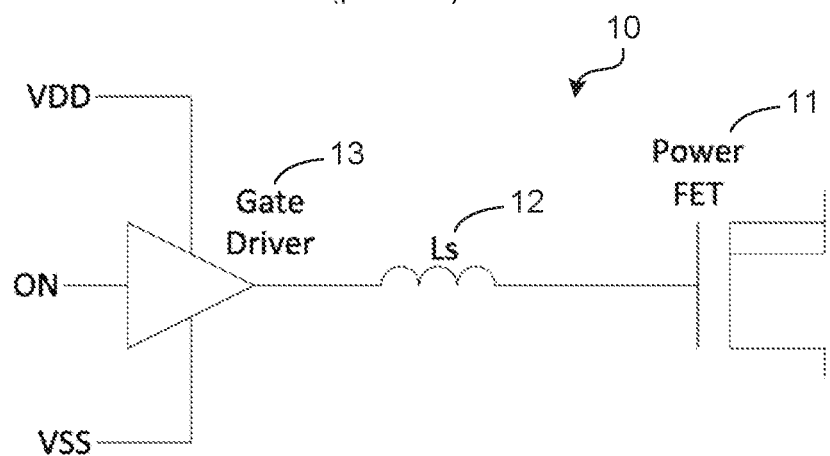
FIG. 1 shows an example schematic of a power switch design known in the art.
Figure 2:
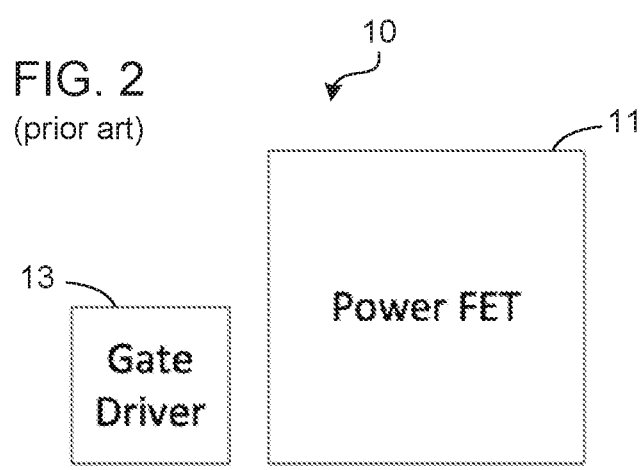
FIG. 2 shows an example layout of the power switch of FIG. 1.

Power switches, such as the traditional DC/DC converter 10 shown in FIGS. 1 and 2, use discrete power FETs and gate drivers. FIG. 1 is a schematic view, while FIG. 2 provides a layout view. This approach fundamentally limits how quickly the power FET can be switched on and off due to the following two basic facts. First, the power FET 11 has a large gate capacitance, often in the nF range. Second, the inductance 12 between the gate driver 13 and the power FET 11 is significant due to physical spacing of components such as ~1 nH/mm of separation. The product of the series inductance Ls and gate capacitance Cg creates a resonant tank circuit. Hard switching of this circuit (with very fast edges) creates significant, long-lasting ringing, which significantly reduces DC/DC converter efficiency. To snub the ringing, the gate driver 13 has to include a significant amount of output resistance Rs (e.g., 0.5 Ohm). The overall tank circuit then becomes an RLC circuit with a characteristic frequency and damping constant. In practical situations, it is not possible to switch such circuits on a sub-nanosecond timescale. In addition, the series resistance decouples the gate driver 13 from the power FET 11 at very high frequencies. This means that a severe transient at the output of the power FET 11 can couple back to the gate via the drain-gate capacitance Cdg and turn the power FET 11 on when it should remain off. This also reduces the power conversion efficiency.

To improve the situation, other known designs have integrated the gate driver and the power FET into a common package or even on a single die. This goes a long way towards reducing the Ls inductance, thus allowing a lower output impedance (Rs) gate driver to be used. This approach simultaneously allows faster switching and allows the gate driver to be more strongly coupled to the power FET for high frequencies. However, even co-locating the gate driver and power FET on the same die still gives significant series inductance Ls. As mentioned above, inductance of a straight conductor is approximately 1 nH/mm regardless of whether the conductor is a printed circuit board (PCB) trace, package lead or on-chip wire. That is, the inductance is quite insensitive to the conductor diameter. Consider a practical application where a 10 mOhm power FET is needed, which can consume an area of up to 2 mm×2 mm. Therefore, the gate driver is at least 1 mm away from the center of the power FET, resulting in about 1 nH inductance.

With currently known gate driver designs, there is a fundamental lower limit to the series inductance Ls that can be achieved, and therefore, the speed with which the FETs can be switched. In known designs, the use of high Vt power FETs is required, and the switching frequency and the achievable power converter efficiency that can be achieved are limited.

In some embodiments of the present disclosure, a distributed layout for the gate driver and power transistor (e.g., FET) is created. In some embodiments, segments of a gate driver are interspersed among the segments of a power FET on the semiconductor die. A supply-decoupling capacitance is also distributed among the gate driver segments to reduce Vdd and Vss inductance on the gate driver segments (which also effectively are in series with Ls). This decoupling capacitor may be placed on top of the active circuitry to save space, such as being placed in an interconnect layer(s) or a redistribution layer (RDL) or using a layer transfer technique. Alternatively, the decoupling capacitor may be adjacent to the active circuitry. In some embodiments, each decoupling capacitor segment corresponds to and is adjacent to one of the plurality of gate driver segments. In other embodiments, the gate driver segments and the power transistor segments are arranged as interdigitated fingers, and the decoupling capacitor segments are distributed along the gate driver segment fingers. In some embodiments, the gate driver segments and the power FET segments are arranged in a surrounding arrangement, such that the gate driver segments surround the power FET or the power FET segments surround the gate driver. Such embodiments may include an array of the surrounding arrangement of gate driver segments and power FET segments. In certain embodiments, at least some of the decoupling capacitor segments are located in a gate oxide layer of the semiconductor device. In other embodiments, the gate driver segments are fabricated within a horizontal area of the semiconductor die, and the decoupling capacitor segments are above the gate driver segments within the horizontal area, i.e., vertically aligned with the horizontal area of the gate driver. In some embodiments, each decoupling capacitor segment is within 500 μm of a corresponding gate driver segment in the plurality of gate driver segments.

FIGS. 3 and 4 show example layouts of how gate driver segments 150 without (FIG. 3) and with (FIG. 4) decoupling capacitor segments 151 may be physically distributed on a die 152 or 153 in accordance with some embodiments. In die 152 of FIG. 3, gate driver segments 150 are interspersed between power FET segments 154. In this embodiment, the segments 150 and 154 are linear arrangements that are interdigitated between each other. The gate driver (i.e., segments 150) is thus distributed evenly throughout the power FET (i.e., segments 154). In other embodiments, the distributed gate driver and FET elements may be distributed in various configurations, such as adjacent to each other in linear arrangements, as FET segments encircling gate driver segments, or gate driver segments surrounding FET segments.

FIG. 4 is similar to FIG. 3, but with the addition of each capacitor segment 151 adjacent to each power FET segment 154. The capacitance of the semiconductor die 152 or 153 is thus distributed among the gate driver (i.e., segments 150), such as one capacitor segment 151 for each gate driver segment 150 and power FET segment 154. In some embodiments, the gate driver (i.e., segments 150) is fabricated within a defined horizontal area or layer of the semiconductor die 152 or 153, and the decoupling capacitor segments 151 are located above or below the gate driver segments 150. For example, the decoupling capacitor segments 151 may be vertically aligned with the horizontal area in some embodiments, such as being fabricated using inter-metal or RDL layers of the semiconductor die 152 or 153, and thus being located above the gate driver (i.e., segments 150). In other embodiments, the decoupling capacitor segments 151 may be adjacent to the gate driver segments 150, such as by using the gate oxide layer to make part of the decoupling capacitor segments 151.

Figure 5:
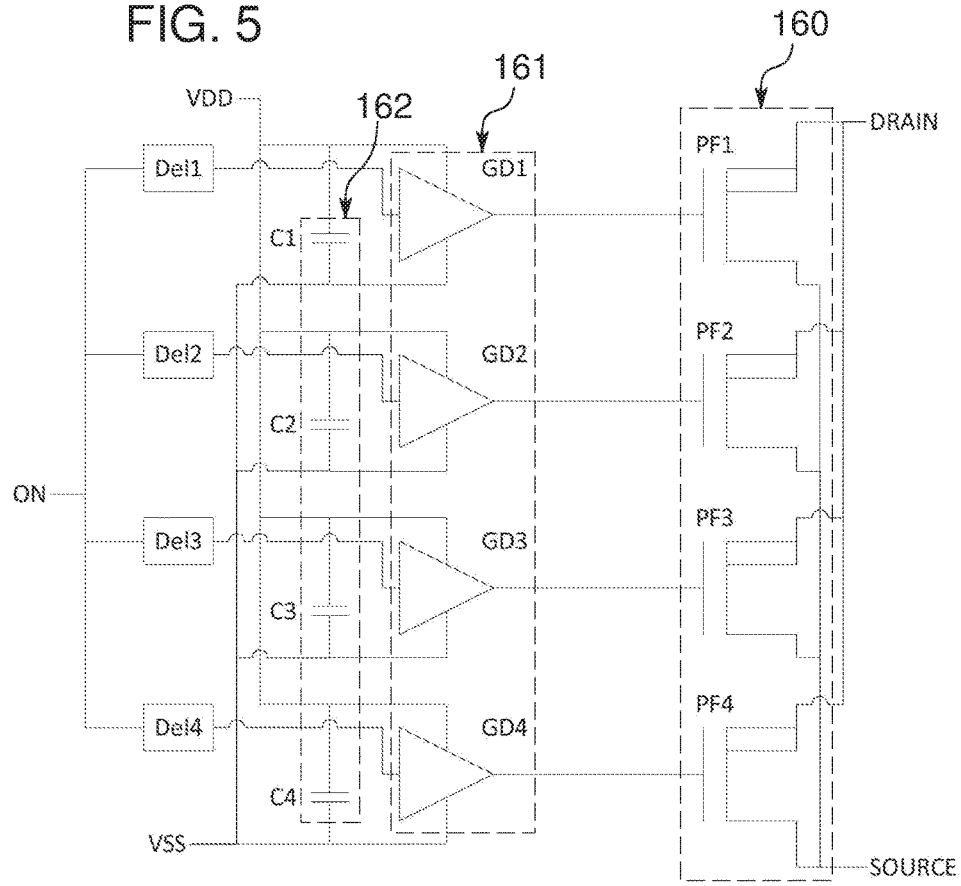
FIG. 5 is a simplified example schematic of a power switch in accordance with some embodiments.

A schematic representation is shown in FIG. 5 for an example embodiment in which a power FET 160 has four segments (for diagram simplicity). The segments of power FET 160 are labeled PF1, PF2, PF3 and PF4. Additionally, a gate driver 161 has four gate driver segments (GD1, GD2, GD3, GD4), each associated with a power FET segment (PF1, PF2, PF3, PF4). For example, the gate driver segments (GD1, GD2, GD3, GD4) can be fingers that are interspersed, such as by being interdigitated between the power FET segments/fingers (PF1, PF2, PF3, PF4). A decoupling capacitor 162 is distributed into four segments (C1, C2, C3, C4), each placed adjacent to one of the gate driver segments (GD1, GD2, GD3, GD4). Having the decoupling capacitance (which may also be referred in this disclosure to as "decoupling cap") in close proximity to the gate driver 161 improves performance of a power converter by improving speed and reducing energy loss. It should be noted that no particular implementation of the gate driver 161, the power FET 160 or the decoupling cap 162 is implied by the schematic of FIG. 5. All of the different methods of implementing these elements are covered in this disclosure. For example, the power FET 160 may be a DMOS transistor, JFET, etc. The gate driver 161 may be a chain of inverters or buffers, a constant current source, etc. The decoupling cap 162 may be implanted using gate oxide, inter-metal capacitance, RDL layers, etc.

Optional delay elements (De11, De12, De13, De14) are also shown in FIG. 5, which can be used to control the delay between the different parts of the array switching on/off. This delay can be used beneficially, for example, to control the duration of the switch on/off transients in order to limit electromagnetic (EM) emissions, etc. The delay elements (De11, De12, De13, De14) may be implemented in any suitable fashion, such as transmission line, RC constant, inverter chain and the like.

Figure 6:
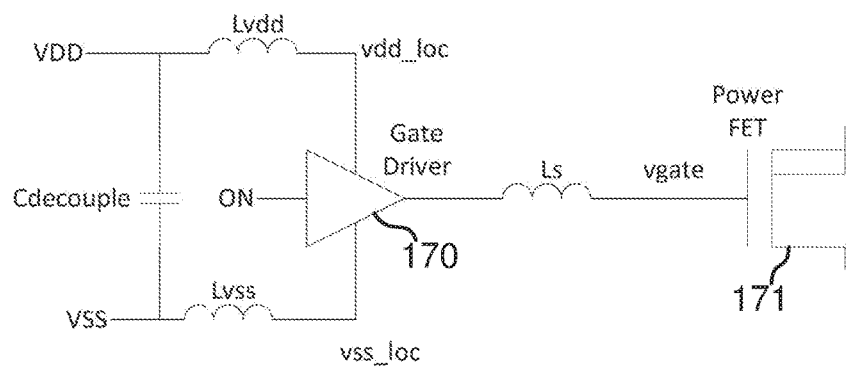
FIG. 6 shows a simplified schematic diagram of a gate driver/FET segment for use in the power switch shown in FIG. 4 in accordance with some embodiments.

The purpose of distributing the decoupling capacitance is understood by looking at the diagram of FIG. 6, which provides a more detailed view of one pair of gate driver 170 (e.g., GD1, GD2, GD3, GD4 of FIG. 5) and power FET 171 (e.g., PF1, PF2, PF3, PF4 of FIG. 5) segments of FIG. 5 in accordance with some embodiments. In FIG. 6, Lvdd and Lvss represent the inherent inductance from wire conductors in the circuit—that is, the inductance in series with the supply and ground connection—where Vdd is the drain voltage and Vss is the source voltage. Even if the Ls is minimized by distributing the gate driver 161 (i.e., gate driver 170 is closer to the power FET 171, thus resulting in less inductance), Lvdd and Lvss will still act to limit how quickly the power FET 171 can be switched on and off. There are two main reasons why this occurs. Firstly, the decoupling capacitor Cdecouple acts as the energy reservoir to power the gate driver 170 itself, so during a sudden transient the local voltages vdd_loc and vss_loc can collapse if Lvdd and Lvss are too large. Secondly, for charging the gate of the power FET 171, a significant energy source is required (to charge several nF of capacitance on the gate), and the presence of Lvdd and Lvss limits the instantaneous current peak available to charge the gate of the power FET 171. To combat both of the problems above, the decoupling capacitor Cdecouple is distributed throughout the array alongside or on top of the bits of the gate driver 170.

Distribution of the decoupling capacitor Cdecouple into the semiconductor die 153 may be achieved by forming the decoupling capacitor Cdecouple in, for example, the gate oxide, from metal-intermetal layers, redistribution layers, or bonding it on the semiconductor die 153. In some embodiments, part of the decoupling capacitor Cdecouple is fabricated in the gate oxide, which can provide a high-density capacitor. In other embodiments, the decoupling capacitor Cdecouple is fabricated in the inter-metal or RDL layers, being located above the semiconductor circuitry and saving chip area.

Simulations of transient responses of a power FET without a distributed capacitor and a power FET (e.g., 171) with a distributed capacitor (e.g., Cdecouple) are shown in FIGS. 7 and 8, respectively. In FIG. 7, a simulated case is shown where Lvdd and Lvss are set to 1 nH each. On-chip metal traces can be approximated as 1 nH/mm, for practical situations where the length of the trace is significantly larger that the width. Thus, the case in FIG. 7 represents an example where a conventional decoupling cap is 1 mm away from the gate driver/power FET array, which is actually an optimistic situation. As can be seen in FIG. 7, there is significant ringing on vdd_loc (top line 181), vss_loc (middle line 182) and vgate (bottom line 183) persisting for over 1 microsecond. That is, the local supply (vdd_loc/vss_loc) on the gate driver is collapsing transiently, which in turn causes oscillations on the gate of the power FET 171 and a general slowing down of how quickly it can be switched on and off. Such ringing not only severely degrades the power conversion efficiency in a real application, but also generates significant EM interference that can affect nearby systems.

In comparison, the simulation of FIG. 8 shows an example embodiment in which the decoupling capacitor Cdecouple has been distributed, and where Lvdd and Lvss are 10 pH. For example, the distributed decoupling capacitors Cdecouple may be 10 µm away from the gate driver 170, which corresponds to 10 pH. As can be seen in FIG. 8, the transitions in the voltage responses (vdd_loc line 191, vss_loc line 192, and vgate line 193) are relatively clean by comparison with the example of FIG. 7 (corresponding lines 181, 182 and 183, respectively), with only small glitching lasting less than 1-2 nanoseconds. In various embodiments, the decoupling capacitors Cdecouple may be distributed to achieve inductances Lvdd and Lvss of less than or equal to, for example, 100 pH. That is, the decoupling capacitor Cdecouple may be within 500 µm, such as within 100 µm, from the gate driver 170. For example, decoupling capacitor segments of Cdecouple may each be within 500 µm of gate driver segments of gate driver 170. FIG. 8 clearly shows that distributing capacitance with a gate driver for a power switch greatly reduces oscillations in the voltage response of a power FET, thus increasing the rate at which a power FET can be switched on and off and improving power conversion efficiency.

Another embodiment of distributing the gate driver is shown in FIG. 9. In this alternative implementation, provision has been made for distributing only part of the gate driver (segments 201), e.g. just the last stage or just one part of the last stage. In other embodiments, similar distribution layouts can be applied for distributing the decoupling cap throughout the array. In the embodiment of FIG. 9, it should be assumed that the decoupling capacitance is distributed along with the gate driver (segments 201), even though this is not explicitly shown in order to make the diagram more readable.

In conventional converters in which the driver/control circuitry and power device are implemented on the same die, when the power device turns off, a large amount of charge may dissipate into the substrate and potentially create noise in adjoining circuitry. In some embodiments of the present disclosure where the gate driver is distributed throughout the power FET, implementing the combined circuit on an SOI (silicon-on-insulator) die alleviates the noise issue because the charge from the power device does not dissipate and affect additional circuitry on the die.

Some or all of the embodiments described herein may be achieved on SOI-based processes. However, on some processes (e.g. bulk CMOS with trench isolation), some implementations may consume excessive area. The reason for this is that a certain spacing needs to be maintained between the power FET fingers and the gate driver fingers to avoid the twin problems of voltage breakdown and latch-up. In these cases, distributing only a part of the gate driver into the power FET layout is also possible, such as only distributing the N-half of the final stage of the gate driver driving a power NFET, or distributing the P-half of the final stage of the gate driver for a PFET.

Other geometries for distributing the gate driver or parts thereof are also possible, and beneficial in many situations. For example, distributing a gate driver 202 concentrically around the periphery of a power FET 203, as shown in FIG. 10, provides improved performance over a conventional gate driver sitting next to the power FET. That is, FIG. 10 illustrates power FET 203 surrounded by gate driver 202, where the gate driver 202 is distributed in gate driver segments to surround the power FET 203. In embodiments in accordance with FIG. 10, the effective inductance may be cut down by at least a factor of four.

Figure 12:
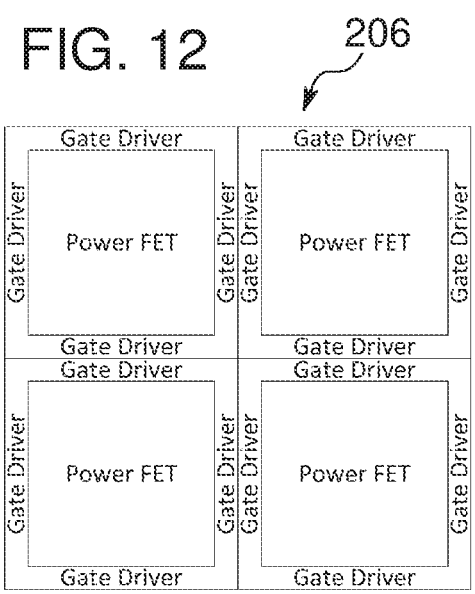
FIG. 12 shows a simplified layout diagram of another alternative power switch in accordance with some embodiments.

In some embodiments, as shown in the example layout of FIG. 11, the gate driver 204 is seated in the center and the power FET 205 is arranged concentrically around it, e.g., as in a square or rectangular shape surrounded by another square or rectangular shape where both shapes have center points that align within an acceptable tolerance. That is, in FIG. 11 power FET segments of power FET 203 surround or circumscribe the gate driver 202. Both of the geometries of FIGS. 10 and 11 where the gate driver segments and the power FET segments are arranged concentrically with respect to each other (a surrounding arrangement with gate driver 202 or 204 on the inside or the outside of the power FET 203 or 205) give a similar reduction in Ls. Some embodiments having other geometric arrangements will be readily apparent, such as an array 206 of gate driver segments and power FET segments, each unit of the array having surrounding arrangements as shown in FIG. 12. The embodiments of FIGS. 10, 11 and 12 may additionally include decoupling capacitor segments 151 (not shown in FIGS. 10-12 for clarity) distributed among the gate driver segments similar to FIG. 4.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A semiconductor device comprising:
 a semiconductor die;
 a power switch including a power field effect transistor (FET) having a plurality of power FET segments formed in the semiconductor die;
 a gate driver having a plurality of gate driver segments formed in the semiconductor die, at least a portion of the gate driver segments being distributed among the power FET segments; and
 a decoupling capacitor having a plurality of decoupling capacitor segments formed in the semiconductor die, the decoupling capacitor segments being distributed among the gate driver segments.

2. The semiconductor device of claim 1, wherein each decoupling capacitor segment in the plurality of decoupling capacitor segments corresponds to and is adjacent to one of the gate driver segments in the plurality of gate driver segments.

3. The semiconductor device of claim 1, wherein the gate driver segments and the power FET segments are arranged as interdigitated fingers, and the decoupling capacitor segments are distributed along the gate driver segments.

4. The semiconductor device of claim 1, wherein the gate driver segments and the power FET segments are arranged in a surrounding arrangement, such that the gate driver segments surround the power FET segments or the power FET segments surround the gate driver segments.

5. The semiconductor device of claim 4, further comprising an array of the surrounding arrangement of gate driver segments and power FET segments.

6. The semiconductor device of claim 1, wherein at least some of the decoupling capacitor segments are located in a gate oxide layer of the semiconductor device.

7. The semiconductor device of claim 1, wherein the gate driver segments are fabricated within a horizontal area of the semiconductor die, and the decoupling capacitor segments are above the gate driver segments within the horizontal area.

8. The semiconductor device of claim 7, wherein the decoupling capacitor segments are in a redistribution layer or an inter-metal layer of the semiconductor die.

9. The semiconductor device of claim 1, wherein each decoupling capacitor segment is within 500 μm of a corresponding gate driver segment in the plurality of gate driver segments.

* * * * *